United States Patent [19]

Maier et al.

[11] Patent Number: 4,920,455
[45] Date of Patent: Apr. 24, 1990

[54] RADIO FREQUENCY DEVICE CIRCUIT ARRANGEMENT

[75] Inventors: Gerhard Maier, Dauchingen; Betram Fischer, Deisslingen, both of Fed. Rep. of Germany

[73] Assignee: Deutsche Thompson-Brandt GmbH, Villingen, Fed. Rep. of Germany

[21] Appl. No.: 286,631

[22] Filed: Dec. 19, 1988

Related U.S. Application Data

[63] Continuation-in-part of Ser. No. 626,676, Jul. 2, 1984, abandoned.

[30] Foreign Application Priority Data

Jul. 1, 1983 [DE] Fed. Rep. of Germany ....... 8319031

[51] Int. Cl.$^5$ .......................... H04B 1/08; H05K 9/00
[52] U.S. Cl. ..................................... 361/424; 334/85; 455/347; 361/399
[58] Field of Search .......... 334/85; 174/35 R, 35 TS, 174/52.1, 52.3; 455/347, 348; 361/331, 380, 392, 395, 397, 399, 400, 405, 412, 413, 424, 417, 419, 422, 423, 429

[56] References Cited

U.S. PATENT DOCUMENTS 3,818,349  6/1974  Ma ........................................ 361/424
4,404,617  9/1983  Ohyama ............................. 361/424

FOREIGN PATENT DOCUMENTS 2909524  9/1979  Fed. Rep. of Germany .

Primary Examiner—Gerald P. Tolin
Attorney, Agent, or Firm—Horst M. Kasper

[57] ABSTRACT

The present invention provides a radio frequency device circuit arrangement with a UHF and VHF receiver part of a television set, which television set has a single base circuit board frame construction. The board has a soldering side and a component side. A rectangular box frame with a separating wall is attached to the board on the component side. Two subcircuit module boards are attached to circuit board frame and cooperate with the box frame to form the RF circuit arrangement.

31 Claims, 3 Drawing Sheets

FIG. 4
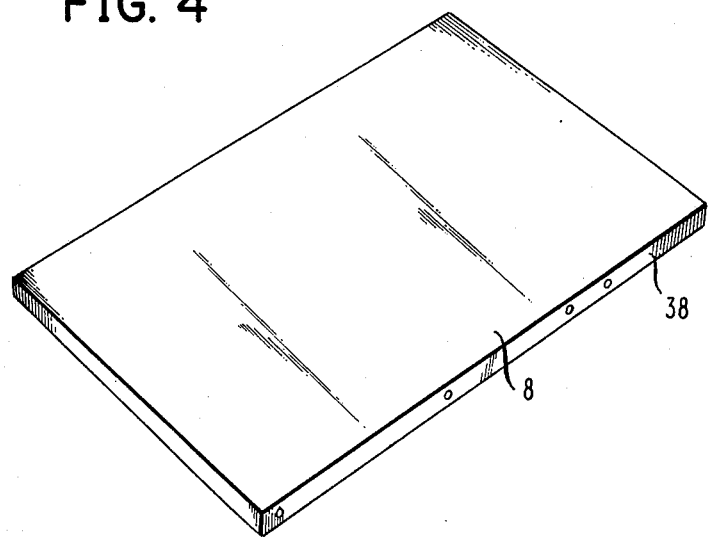
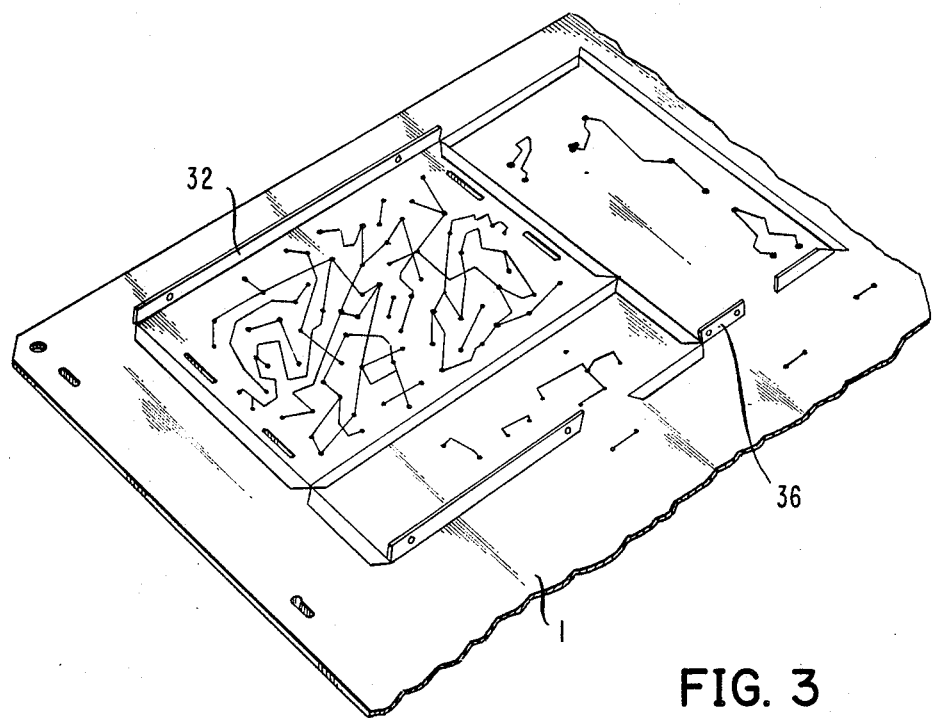
FIG. 3

RADIO FREQUENCY DEVICE CIRCUIT ARRANGEMENT

CROSS-REFERENCE TO RELATED APPLICATIONS

This application is a continuation-in-part application of another application filed July 2, 1984 and bearing Ser. No. 626,676, now abandoned. The entire disclosure of this latter application, including the drawings thereof, is hereby incorporated in this application as if fully set forth herein.

BACKGROUND OF THE INVENTION

1. Field of the Invention

The invention relates to a radio frequency device group arrangement.

2. Brief Description of the Background of the Invention Including Prior Art

Single circuit board frames are already frequently used for television receivers. It has now become necessary to employ an automatic placement and attaching of chip-components and integrated circuits in order to reduce costs. Such automatic placement has been difficult in the past in the tuning section, since a complete shielding is unavoidable and since variants of some circuit switching components based on different ranges and standards, the so-called variables, are not to influence negatively the costs in the countries to which the sets are to be supplied.

SUMMARY OF THE INVENTION

1. Purpose of the Invention

It is an object of the invention to avoid the difficulties of the art and to solve the problem of the variables without increasing production an balancing costs.

2. Brief Description of the Invention

The present invention provides a radio frequency device circuit arrangement with an UHF and VHF receiver part of a television set, which television set has a single circuit board construction. A radio frequency device circuit is an electronic circuit relating to frequencies employed in electromagnetic transmission through the atmosphere.

Known radio frequency device components are integrated into a single board frame. A first rectangular box frame provided with corresponding separating walls is attached as a shield standing perpendicular on the side of the single base circuit board frame loaded with components of a UHF and VHF receiver part. A flatter corresponding box frame is provided on the soldering side and is conductingly connected along its circumference to the first rectangular box frame via a plurality of connecting sections. The rectangular box frame in turn is at the edges sealingly connected from the loaded side as well as from the soldering side with, in each case, a cover with spring tongues or spring fish plates or screw holes. Two subcircuit board modules are connected with their own radio frequency component application groups on the side of the single base board loaded with components and disposed perpendicular to the single base board and parallel to each other. The subcircuit board modules are connected via corresponding connections to the cooperating parts of the radio frequency device groups of the single circuit board base, and the which subcircuit board modules comprise variable application specific UHF and/or, respectively, VHF selection and pre-stages, which subcircuit board modules thus contain collected and concentrated the application-dependent variables of the respective circuits, such as ranges and/or country standards.

The connections can include soldering and/or plug connections.

A radio frequency apparatus subassembly comprises a single base circuit board having a side loaded with device components and having a soldering side. Radio frequency device components are integrated onto the side of the single base circuit board loaded with device components. A rectangular box frame having box walls is placed and attached onto the single base circuit board frame. A separating wall is disposed in the box frame and between box frame walls. A first subcircuit module board is attached between the single base circuit board frame, the separating wall, and one of the walls of the box frame, and facing a second wall of the box frame, adjoining the first wall of the box frame, and supporting the separating wall. The components of the first subcircuit module board are loaded with device elements on the side of the first subcircuit module board facing the second wall of the box frame. The second side of the first subcircuit board module is substantially a soldering side. A second subcircuit module board is attached between the single base circuit board frame, the separating wall, and the first wall of the box frame, and having a substantially soldering side facing the soldering side of the first subcircuit board module and loaded with components on its second side. The first subcircuit board module and/or the second subcircuit board module comprise application-dependent selectable specific UHF and/or, respectively, VHF selection and pre-stages. The respective subcircuit board modules contain collected specific application-dependent variables such as ranges and/or country standards.

Support extensions of the subcircuit board modules can be disposed perpendicular to a respective subcircuit board plane and disposed about parallel to the single base circuit board frame.

A second separating wall can be attached to the first wall of the box frame and to the first separating wall, and can be disposed about parallel to the second subcircuit board module at a close distance from the second subcircuit board module for shielding device components loaded onto the second subcircuit board module.

A radio frequency device circuit arrangement of an UHF and VHF receiver part of a television set comprises a single base circuit board construction. Radio frequency device components are integrated into a single base circuit board frame. A rectangular single base circuit board frame, provided with corresponding separating walls, is attached as a shield standing on the side of the single base circuit board frame loaded with components, and by providing on the soldering side a flatter corresponding frame along its circumference conductingly connected to the first rectangular frame via a plurality of connecting sections. Said rectangular single base circuit board frame in turn is sealingly connected at the edges from the loaded side as well as from the soldering side of the single base circuit board frame, with, in each case, a cover with spring tongues or spring fish plates or screws. On the side of the single base board frame loaded with components, two subcircuit board modules are connected with their own application-specific radio frequency component groups, disposed perpendicular to the single base circuit board frame and parallel to each other and connected via corresponding connections, to the cooperating parts of the radio frequency device groups. Said subcircuit board modules comprise variable specific UHF and, respectively, VHF selection and pre-stages, and thus contain collected selected application-specific variables of the respective circuits such as ranges and/or country standards.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention:

FIG. 3 is a perspective schematic bottom view of the circuit construction arrangement, FIG. 4 is a perspective view of a bottom cover.

DESCRIPTION OF INVENTION AND PREFERRED EMBODIMENT

Figure 1:
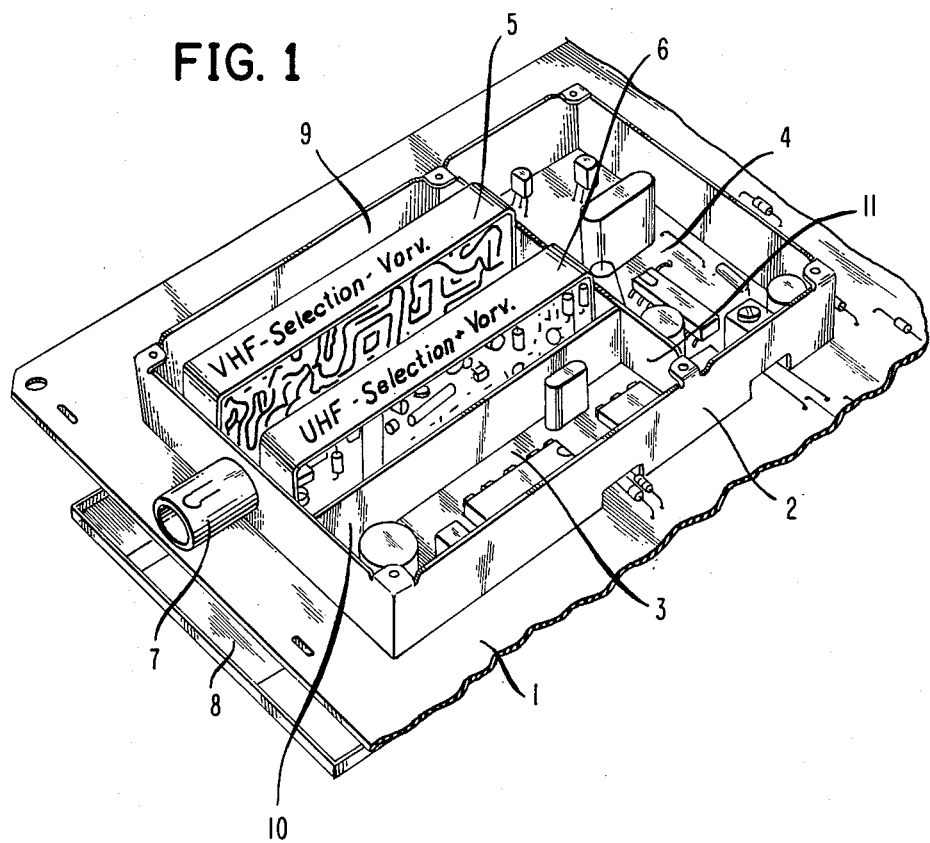
FIG. 1 is a perspective top view of the circuit construction arrangement.

In accordance with the present invention, the variable circuit components are concentrated onto two circuit board modules, which circuit board modules in each case are provided with shielding box frame 2. The rectangular shielding box frame 2 is disposed perpendicular to the single base circuit board frame parallel to each other, and is plug-connectable or soldered at their long narrow side forming a sealing connection 2, 34; 36, 38 within the other radio frequency components provided with a shielding box frame 2 with upper 21 and lower cover 8. These subcircuit board modules 5, 6 can comprise UHF-selection and preamplifier stage or, respectively, VHF-selection and preamplifier stage. In this manner, it is advantageously possible to load the single base circuit board 1 substantially automatically, and the separately manufactured and pretuned subcircuit board modules 5, 6 are employed depending on the application variables required. Then, the upper shielding cover 21 is placed onto the rectangular box frame 2 for shielding and protection against damage.

The rectangular box frame 2 is provided with corresponding separating walls 10, 11 and is attached on the side of the single base circuit board loaded with components. The separating walls are preferably disposed parallel and/or perpendicular to respective side walls and perpendicular to the single base circuit board.

Figure 2:
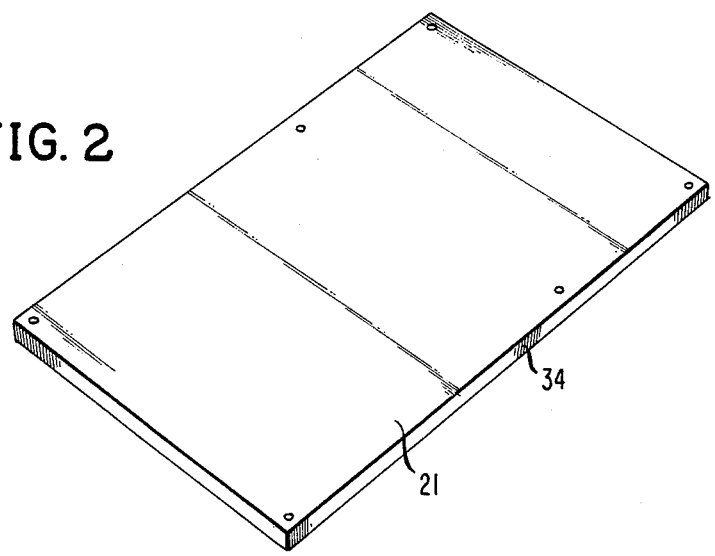
FIG. 2 is a perspective top view of a top cover.
Figure 5:
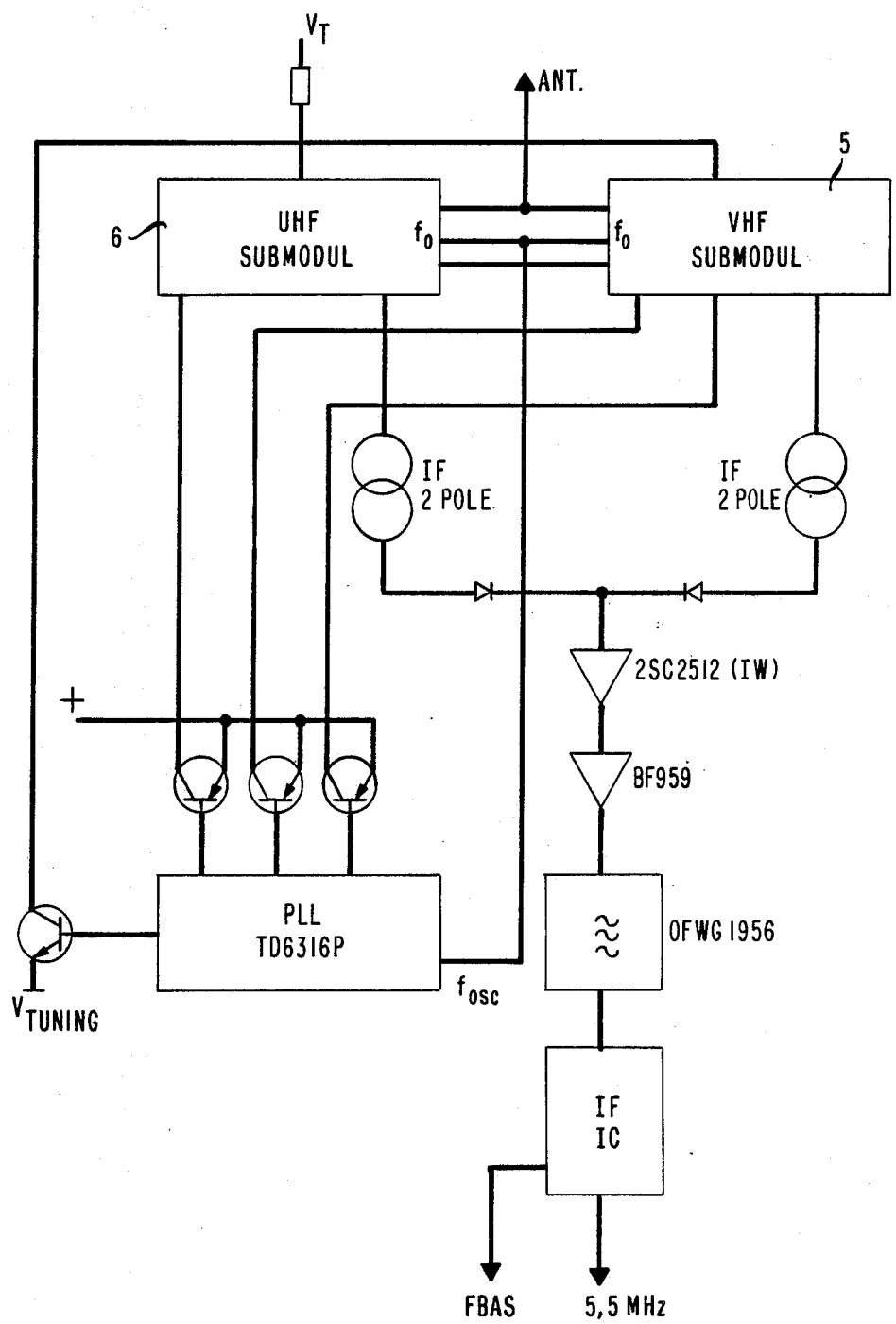
FIG. 5 is a schematic circuit diagram corresponding to the circuit construction arrangement.

The drawing shows in FIG. 1 the section of the single base circuit board of a television set containing the tuner in a perspective view. The box frame 2 surrounds all radio frequency component groups belonging to the radio frequency tuner, including a phase-locked loop circuit with predivider and control transistors. The latter are disposed in a chamber 3 provided with a separating wall 10, 11. The parts of the video intermediate amplifier and of the demodulator are disposed in a further chamber 4. The radio frequency input is provided at the plug connection 7. The subcircuit board modules 5 and 6 with the VHF-selection and the preamplifier stage and, respectively, the UHF selection and preamplifier stage, are placed on their narrow side and parallel to each other connected and attached to the single base circuit board 1 in the main chamber 9. The single base circuit board switching connection of the subcircuit board modules and of the remaining radio frequency groups and the UHF as well as VHF filters and the VHF mixer is provided via very short connections running on the soldering side of the single base circuit board frame. As can be recognized from FIG. 1 of the drawing, the soldered sides of the two subcircuit board modules 5 and 6 are disposed facing toward each other such that the component elements on the sides of the subcircuit board modules loaded with devices and application specific components are more easily accessible for a possible retuning. The lower cover 8 is shown (FIGS. 1 and 2) and the upper cover was left out for better viewing of the set.

The cover 8, 21 having rims 38, 34 can sealingly be attached to the loaded side or to the soldering side of the board forming overlapping seals 2, 34; 36, 38.

The positioning of the application dependent device elements on respective subcircuit boards disposed perpendicular to a main single base circuit board provides a very compact structure and short connection wires eliminating undesirable radiation. The subcircuit board modules can have an area from about 0.05 to 0.2 of the loaded area of the main single base circuit board.

A radio frequency device circuit arrangement of an UHF and VHF receiver part of a television set is disclosed, which television set has a single base circuit board construction. Known radio frequency device components are integrated into a single base circuit board. A rectangular frame, provided with corresponding separating walls, is attached as a shield standing on the side of the single base circuit board loaded with components, with sections protruding along its circumference through the printed board via a series of sections. Said sections have protruding end-section pieces, which end section pieces are coming out somewhat on the soldering side, which, in turn, is at the edges sealingly connected from the loaded side as well as from the soldering side with, in each case, a cover with spring tongues or spring fish plates 38. On the side loaded with components, two subcircuit board modules are connected with their own radio frequency component groups disposed perpendicular to the single base board frame and parallel to each other and connected via corresponding connections to the cooperating parts of radio frequency device groups. Said subcircuit board modules comprise variable specific UHF and, respectively, VHF selection and/or pre-stages, which thus contain specific application variables such as ranges and/or country standards.

The two subcircuit board modules can be elongated in parallel to the single base circuit board frame. A section of the rectangular box frame can pass at one of the ends of each subcircuit board module. A separating wall, running about parallel to the section of the rectangular frame, can pass at about a right angle near the respective second end of each subcircuit board module.

The parts of the video intermediate amplifier can be disposed in a chamber adjoining the separating wall passing near the respective end of each subcircuit board module.

The soldering sides of the two subcircuit board modules can face each other. The subcircuit board module, corresponding to the VHF section, can be directed with its side carrying the components to a corner of the single base circuit board frame. A separating wall can run parallel to the UHF section board near the UHF section board. The control transistors can be disposed in a section adjoining the parallel running separating wall.

Preferably, the connections include soldering connections and plug connections. The soldering sides of the two subcircuit board modules can face each other. The subcircuit board modules can include a flat strip section on the side remote from the single base circuit board frame and running about parallel to the single base circuit board frame and protruding from the respective subcircuit board module on the side where the circuit components of the respective subcircuit board module can be located.

The subcircuit board module, corresponding to the VHF section, can be directed with its side carrying the components to a corner of the single base circuit board frame.

A separating wall can run parallel to the UHF section board near the UHF section board. The control transistors can be disposed in a section adjoining the parallel running separating wall.

The two subcircuit board modules can extend by an about equal amount about perpendicular from the single base circuit board. The two subcircuit board modules can be disposed toward each other such that the component elements located on the sides can be more easily accessible for a possible retuning.

It will be understood that each of the elements described above, or two or more together, may also find a useful application in other types of electronic system configurations and signal processing procedures differing from the types described above.

While the invention has been illustrated and described as embodied in the context of a radio frequency circuit, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A radio frequency apparatus subassembly comprising
   a single base circuit board having a side loaded with device components and having a soldering side;
   device components employed in radio frequency circuits and integrated onto the side of the single base circuit board loaded with device components;
   a rectangular box frame having box walls placed and attached onto the component side of the single base circuit board;
   a separating wall disposed in the box frame and between box frame walls;
   a first subcircuit module board attached between the single base circuit board, the separating wall, and one of the walls of the box frame, and disposed parallel to a second wall of the box frame, said second wall of the box frame forming a corner with the first wall of the box frame, and said second wall of the box frame maintaining the separating wall in position, where function elements of the first subcircuit module board are provided with device elements on the side of the first subcircuit module board facing the second wall of the box frame, and where the second side of the first subcircuit board module is substantially a soldering side;
   a second subcircuit module board attached between the single base circuit board, the separating wall, and another of the walls of the box frame, and having a substantially soldering side facing the soldering side of the first subcircuit board module and loaded with components on its second side, wherein the first subcircuit board module and/or the second subcircuit board module comprise application-dependent selectable specific UHF and/or, respectively, VHF selection and pre-stages, and wherein the respective subcircuit board modules further contain some variable component elements.

2. The radio frequency apparatus subassembly according to claim 1 further comprising support extensions of the subcircuit board modules disposed perpendicular to a respective subcircuit board plane and disposed substantially parallel to the single base circuit board.

3. The radio frequency apparatus subassembly according to claim 1 further comprising a second separating wall attached to the first wall of the box frame and to the first separating wall, and disposed substantially parallel to the second subcircuit board module at a close distance from the second subcircuit board module for shielding device components loaded onto the second subcircuit board module.

4. A radio frequency device circuit arrangement of a UHF and VHF receiver part of a television set, which television set has a single base circuit board construction wherein
   device components employed in radio frequency circuits are integrated into a single base printed circuit board, where a rectangular frame, provided with corresponding separating walls, is attached as a shield standing on the single base circuit board loaded with components, with sections of the shield protruding along a circumference of the printed circuit board and through the printed board via a series of sections, which sections have protruding end-section pieces, which end section pieces are protruding to some extent on the soldering side of the printed circuit board, which shield in turn is at edges sealingly connected from the loaded side as well as from the soldering side with, in each case, a cover with projecting portions engaging with the series of sections, and where, on the side loaded with components, two subcircuit board modules are connected with their own component groups employed in radio frequency circuits and said two subcircuit board modules are disposed perpendicular to the single base board and parallel to each other and connected via corresponding connections to the cooperating parts of device groups employed in radio frequency circuits, which subcircuit board modules further comprise some variable components or elements.

5. The radio frequency device circuit arrangement of an UHF and VHF receiver part of a television set according to claim 4 wherein the two subcircuit board modules are elongated in parallel to the single base circuit board, where a section of the rectangular box frame passes at one of the ends of each subcircuit board module, and where a separating wall, running substantially parallel to the section of the rectangular frame, passes at about a right angle near the respective second end of each subcircuit board module.

6. The radio frequency device circuit arrangement of an UHF and VHF receiver part of a television set according to claim 5 wherein parts of the video intermediate amplifier are disposed in a chamber adjoining the separating wall passing near the respective end of each subcircuit board module.

7. The radio frequency device circuit arrangement of an UHF and VHF receiver part of a television set according to claim 6, wherein the soldering sides of the two subcircuit board modules face each other, wherein the subcircuit board module, corresponding to the VHF section, is directed with its side carrying the components to a corner of the single base circuit board, and wherein a separating wall runs parallel to the UHF section board near the UHF section board, and where the control transistors are disposed in a section adjoining the parallel running separating wall.

8. The radio frequency device circuit arrangement of an UHF and VHF receiver part of a television set according to claim 4, wherein the connections include soldering connections.

9. The radio frequency device circuit arrangement of an UHF and VHF receiver part of a television set, according to claim 4, wherein the connections include plug connections.

10. The radio frequency device circuit arrangement of an UHF and VHF receiver part of a television set according to claim 4, wherein the soldering sides of the two subcircuit board modules face each other.

11. The radio frequency device circuit arrangement of an UHF and VHF receiver part of a television set according to claim 10, wherein the subcircuit board modules include a flat strip section on the side remote from the single base circuit board and running about parallel to the single base circuit board and protruding from the respective subcircuit board module on the side where the circuit components of the respective subcircuit board module are located.

12. The radio frequency device circuit arrangement of an UHF and VHF receiver part of a television set according to claim 10 wherein the subcircuit board module, corresponding to the VHF section, is exposed with its side carrying the components to a corner of the single base circuit board.

13. The radio frequency device circuit arrangement of an UHF and VHF receiver part of a television set according to claim 12, wherein a separating wall runs parallel to the UHF section board near the UHF section board, and where control transistors are disposed in a section adjoining the parallel running separating wall.

14. The radio frequency device circuit arrangement of an UHF and VHF receiver part of a television set according to claim 10, wherein the two subcircuit board modules extend by a substantially equal amount about perpendicular from the single base circuit board.

15. The radio frequency device circuit arrangement of an UHF and VHF receiver part of a television set according to claim 4, wherein the two subcircuit board modules are disposed toward each other such that the component elements located on the sides are more easily accessible for a possible retuning.

16. A radio frequency device circuit arrangement of a UHF and VHF receiver part of a television set, which has a single base circuit board construction, wherein
device components employed in radio frequency circuits are integrated into the single base circuit board, wherein a rectangular single base circuit board, provided with a rectangular box frame and corresponding separating walls, said frame is attached as a shield standing on the side of the single base circuit board loaded with components, and provides on the soldering side a flatter corresponding rear frame along its circumference conductingly connected to the rectangular frame via a plurality of connecting parts, which rectangular single base circuit board in turn is sealingly connected at the edges from the loaded side as well as from the soldering side of the single base circuit board, with in each case, a cover with attachment elements, and where, on the side of the single base board loaded with components, two subcircuit board modules are connected with their own application-specific radio frequency component groups, disposed perpendicular to the single base circuit board and parallel to each other and connected via corresponding connections, to the cooperating parts of the device groups employed in radio frequency circuits, which subcircuit board modules comprise variable specific UHF selection stages and, respectively, VHF selection stages and pre-stages, and which subcircuit board modules thus further contain some variable components or elements.

17. In a UHF-VHF receiver portion of a television tuner mounted on a single base circuit board and having receiving components employed in radio frequency circuits, the improvement wherein the receiver portion comprises a shield comprising sidewalls arranged to form a rectangular frame and each having projections extending from one edge which pass through corresponding apertures in the base circuit board for attachment of the shield to the component side of the base circuit board, separating walls arranged to separate the rectangular frame into separate compartments, a first cover having spring tongues or spring fish plates and connected to the sidewall projections and sealed to the soldered side of the base circuit board, and a second cover having attachment elements and sealingly connected to the other edge of each sidewall; a first subframe having UHF radio frequency components on a UHF circuit board, and a second subframe housing VHF radio frequency components on a VHF circuit board, the first and second subframes mounted on the component side of the base circuit board within a compartment of the shield, perpendicular to the base circuit board and parallel to each other, and having connections to provide direct electrical connection between components on the base circuit board and the UHF and VHF circuit boards.

18. The UHF-VHF receiver portion of a television tuner according to claim 17 in which the connections providing electrical connection between the components on the base circuit board and the UHF and VHF circuit boards include soldered connections.

19. The UHF-VHF receiver portion of a television tuner according to claim 17 in which the connections providing electrical connection between the components on the base circuit board and the UHF and VHF circuit boards include plug connections.

20. The UHF-VHF receiver portion of a television tuner according to claim 17 in which the soldered sides of the circuit boards in the first and second subframes face each other.

21. The UHF-VHF receiver portion of a television tuner according to claim 20 in which each subframe projects from either side of the circuit board carried by it.

22. The UHF-VHF receiver portion of a television tuner according to claim 20 in which the second subframe carrying the VHF circuit board is mounted to the base circuit board adjacent and parallel to a sidewall of the rectangular frame with its component side facing the side wall.

23. The UHF-VHF receiver portion of a television tuner according to claim 20 in which the first subframe carrying the UHF circuit board is mounted to the base circuit board adjacent and parallel to a separating wall with its component side facing the separating wall and with the compartment of the shield on the other side of the wall containing control transistors.

24. The UHF-VHF receiver portion of a television tuner according to claim 20 in which the two subframes project outward from the base circuit board by an about equal amount.

25. The UHF-VHF receiver portion of a television tuner according to claim 17 in which the two subframes are mounted on the base circuit board within a single compartment of the shield and have a separating wall passing the corresponding end of each subframe, perpendicular to the subframes.

26. The UHF-VHF receiver portion of a television tuner according to claim 25 in which parts of a video intermediate amplifier are disposed in the compartment adjoining the separating wall passing near the corresponding end of each subframe.

27. The UHF-VHF receiver portion of a television tuner according to claim 26 in which the soldered side of each of the circuit boards carried by each of the two subframes face each other, the second subframe carries the VHF circuit board mounted adjacent a sidewall of the frame with its component side facing the sidewall, a separating wall runs parallel and adjacent to the first subframe carrying the UHF circuit board, and control transistors are disposed in a compartment adjoining the separating wall.

28. The UHF-VHF receiver portion of a television tuner according to claim 17 in which the two subframes are disposed on the base circuit board such that the components located on the sides of the circuit boards are more easily accessible for retuning.

29. The UHF-VHF receiver portion of a television tuner mounted on a single base circuit board and having receiving components employed in radio frequency circuits, the improvement wherein the receiver portion comprises a shield comprising sidewalls arranged to form a first rectangular frame, a second flatter, rectangular frame having a periphery corresponding to that of the first rectangular frame, the first frame mounted on the component side of the base circuit board and the second frame mounted on the soldered side and the frames electrically conductively connected to each other by connecting sections passing through corresponding apertures in the base circuit board, separating walls arranged to separate the first rectangular frame into separate compartments, a first cover having attachment elements and sealingly connected to the second frame, and a second cover having attachment elements and sealingly connected to the first frame; a first subframe having UHF radio frequency components on a UHF circuit board, and a second subframe housing VHF radio frequency components on a VHF circuit board, the first and second subframes mounted on the component side of the base circuit board within a compartment of the shield, perpendicular to the base circuit board, parallel to each other, and having connections to provide direct electrical connection between components on the base circuit board and the UHF and VHF circuit boards.

30. The UHF-VHF receiver portion of a television tuner according to claim 29 in which the connections providing electrical connection between the components on the base circuit board and the UHF and VHF circuit boards include soldered connections.

31. The UHF-VHF receiver portion of a television tuner according to claim 29 in which the connections providing electrical connection between the components on the base circuit board and the UHF and VHF circuit boards include plug connections.

* * * * *